(12) United States Patent
Peck et al.

(10) Patent No.: US 6,700,379 B2
(45) Date of Patent: Mar. 2, 2004

(54) STEEP SOLVENT GRADIENT NMR ANALYSIS METHOD

(75) Inventors: Tim L. Peck, Mahomet, IL (US); Dean Olson, Champaign, IL (US); Jim Norcross, Champaign, IL (US)

(73) Assignee: Protasis Corporation, Marlborough, MA (US)

( * ) Notice: Subject to any disclaimer, the term of this patent is extended or adjusted under 35 U.S.C. 154(b) by 40 days.

(21) Appl. No.: 10/006,503

(22) Filed: Dec. 3, 2001

(65) Prior Publication Data

US 2002/0105327 A1 Aug. 8, 2002

Related U.S. Application Data

(60) Provisional application No. 60/250,705, filed on Dec. 1, 2000.

(51) Int. Cl.⁷ .................................................. G01V 3/00
(52) U.S. Cl. ........................................ 324/321; 324/306
(58) Field of Search ................................ 324/321, 306, 324/300, 307, 309, 312

(56) References Cited

U.S. PATENT DOCUMENTS

| | | | |
|---|---|---|---|
| 5,684,401 A | * | 11/1997 | Peck et al. .................. 324/318 |
| 5,705,928 A | * | 1/1998 | Haner et al. ................. 324/321 |
| 5,867,026 A | | 2/1999 | Haner |
| 6,097,188 A | | 8/2000 | Sweedler et al. |
| 6,404,193 B1 | * | 6/2002 | Dourdeville ................ 324/306 |

OTHER PUBLICATIONS

Notification of Transmittal of the International Search Report or the Declaration (7pgs) Application of liquid chromatography–nuclear magnetic resonance spectroscopy to the identification of natural products Steven C. Bobzin, vol. 748, 2000, (pp. 259–267), XP004224401 "Miniature Magnetic Resonance Machines" Richard L. Magin et al., vol. 34, 1997, (pp. 51–61), XP000738785.

* cited by examiner

Primary Examiner—Louis Arana
(74) Attorney, Agent, or Firm—Banner & Witcoff, Ltd.

(57) ABSTRACT

An NMR method of analyzing an analyte comprises feeding an analyte sample fluid to an NMR flow cell. The NMR flow cell comprises an RF microcoil operably associated with an enlarged containment region. The mobile phase of the analyte sample flowing through the NMR flow cell has a solvent gradient greater than 10% per minute. The analyte sample fluid can be fed to the NMR flow cell from an analyte extraction chamber, e.g., operative to perform liquid chromatography, capillary electrophoresis, or the like, especially a capillary-based analyte extraction chamber integrated in an NMR probe with the NMR flow cell. A sample volume is held in the NMR flow cell for equilibration less than 1 hour, preferably less than 30 minutes prior to actuating NMR analysis of the observe volume in the microcoil.

32 Claims, 2 Drawing Sheets

STEEP SOLVENT GRADIENT NMR ANALYSIS METHOD

Figure 1:
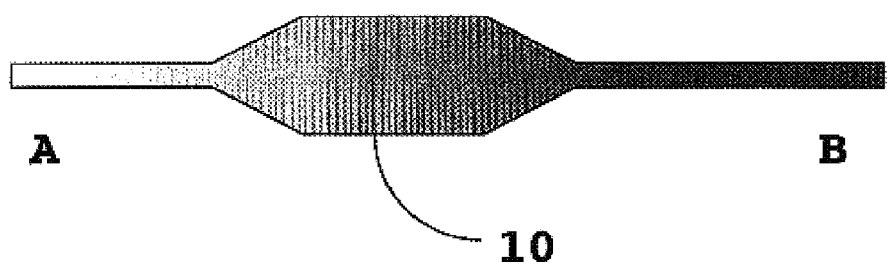

This application claims the benefit of U.S. Provisional Application No. 60/250,705, entitled STEEP SOLVENT GRADIENTS AND SAMPLE PRECONCENTRATION USING CAPILLARY LC-NMR, which was filed on Dec. 1, 2000.

TECHNICAL FIELD

This invention relates to methods and systems for NMR analysis of analytes in small volumes. More particularly, this invention relates to methods and systems employing NMR microcoils for analysis of analytes in, for example, nanoliter sample volumes.

BACKGROUND

Nuclear magnetic resonance spectroscopy, or NMR, is a powerful and commonly used method for analysis of the chemical structure of molecules. NMR provides spectral information as a function of the electronic environment of the molecule and is nondestructive to the sample. In addition, reaction rates, coupling constants, bond-lengths, and two- and three-dimensional structure can be obtained with this technique. NMR combined with liquid chromatography or capillary electrophoresis was demonstrated as early as 1978 using stopped flow (Watanabe et al. (1978) Proc. Jpn. Acad. 54:194), and in 1979 with continuous flow (Bayer et al. (1979) J. Chromatog. 186:497–507), though limitations due to solvent as well as inherent sensitivity curtailed the use of the method. That is, the inherent insensitivity of the NMR method limited its usefulness as a detection method for liquid phase analysis of very small samples, such as effluent from an analyte focusing or concentrating method (those two terms being used here interchangeably unless otherwise indicated), e.g., a liquid chromatography or capillary electrophoretic separation. Conventional NMR spectrometers typically use relatively large RF coils (mm to cm size) and samples in the mu.l to ml volume range, and significant performance advantages are achieved using NMR microcoils when examining very small samples. NMR microcoils are known to those skilled in the art and are shown, for example, in U.S. Pat. No. 5,654,636 to Sweedler et al., and in U.S. Pat. No. 5,684,401 to Peck et al., and in U.S. Pat. No. 6,097,188 to Sweedler et al., all three of which patents are incorporated herein by reference in their entireties for all purposes. A solenoid microcoil detection cell formed from a fused silica capillary wrapped with copper wire has been used for static measurements of sucrose, arginine and other simple compounds. Wu et al. (1994a), J. Am. Chem. Soc. 116:7929–7930; Olson et al. (1995), Science 270:1967–1970, Peck (1995) J. Magn. Reson. 108(B) 114–124. Coil diameter has been further reduced by the use of conventional micro-electronic techniques in which planar gold or aluminum R.F. coils having a diameter ranging from 10–200 .mu.m were etched in silicon dioxide using standard photolithography. Peck 1994 IEEE Trans Biomed Eng 41(7) 706–709, Stocker 1997 IEEE Trans Biomed Eng 44(11) 1122–1127, Magin 1997 IEEE Spectrum 34 51–61, which are also incorporated herein by reference in its entirety for all purposes.

Miniature total analysis systems ($\mu$-TAS) are discussed in Integrating Microfluidic Systems And NMR Spectroscopy—Preliminary Results, Trumbull et al, Solid-State Sensor and Actuator Workshop, pp. 101–05 (1998), Magin 1997 IEEE Spectrum 34 51–61, and Trumbull 2000 47(1) 1–6 incorporated herein by reference in its entirety for all purposes. The Trumbull et al. device integrated multiple chemical processing steps and the means of analyzing their results on the same miniaturized system. Specifically, Trumbull et al. coupled chip-based capillary electrophoresis (CE) with nuclear magnetic resonance spectroscopy (NMR) in a $\mu$L-TAS system. Linewidths of 1.4 Hz have been demonstrated using single turn planar NMR coils integrated with microfluidic channels.

Capillary-based liquid chromatography and microcoil NMR have compatible flow rates and sample volume requirements. Thus, for example, the combination of the Waters CapLC™ available from Waters Corporation (Milford, Mass., USA) and the MRM CapNMR™ flow probe available from MRM Corporation (Savoy, Ill.), a division of Protasis Corporation (Marlborough, Mass., USA) provides excellent separation capability in addition to UV-VIS and NMR detection for mass-limited samples. The Waters CapLC™ has published flow rates from 0.02 $\mu$L/minute to 40 $\mu$L/minute. A typical CapLC on-column flow rate is 5 $\mu$L/min, the autosampler-injected analyte volume is 0.1 $\mu$L or more, and accurate flow rates are achieved through capillary of typically 50 $\mu$m inner diameter. The NMR flow cell has a typical total volume of 5 $\mu$L with a microcoil observe volume of 1 $\mu$L. A typical injected sample amount for CapLC-$\mu$NMR analysis is a few $\mu$g (nmol) or less.

Conventional scale LC-NMR systems (flow rates about 1 ML/min) typically employ solvent gradients of 2% per minute to 4% per minute. The probes have typical flow cell volumes of about 150 $\mu$L and typical observe volumes of 30–60 $\mu$L. In such systems, the application of a solvent gradient followed by stopped flow can initially result in severely distorted NMR line shapes due to the magnetic inhomogeneity caused by nonuniform solvent composition in the flow cell. After a reasonable equilibration time, if the solvent gradient is no longer too steep, line shape is seen to recover from the initial stopped flow conditions. However, steep solvent gradients typically result inmagnetic distortions so severe that NMR is practically precluded due to the extremely long recovery time (>>1 hr) necessary to achieve high spectral resolution.

Capillary scale systems also are known. In such systems, a capillary-based analyte extraction chamber can be connected to an NMR flow cell, such as by being positioned as an operation site along a capillary channel extending to the NMR flow cell. Exemplary such integrated capillary-based analyte extraction chambers are shown in U.S. Pat. No. 6,194,900, the entire disclosure of which is incorporated herein by reference for all purposes.

There is a need in the art for improved NMR methods for analyzing analytes. There is a particular need for improved NMR methods of analyzing small samples, especially samples of less than 10 $\mu$L or even less than 1.0 $\mu$L.

Additional objects, advantages and novel features of the invention will be set forth in part in the description which follows, and in part will become apparent to those skilled in the art upon examination of the following, or may be learned by practice of the invention.

SUMMARY

Solvent gradients play an important role in NMR analysis, as indicated above. In accordance with the methods disclosed here, a flow of analyte sample fed to an NMR flow cell has a mobile phase with advantageously steep solvent gradient.

In accordance with a first aspect, a method of analyzing an analyte comprises feeding a fluid flow of analyte sample fluid, that is a fluid containing or suspected of possibly containing one or more analytes of interest in a multicomponent mobile phase to a fluid channel of a nuclear magnetic resonance (NMR) probe. The analyte sample fluid is fed to an NMR flow cell in the fluid channel. The flow cell comprises an RF microcoil operably associated with an enlarged containment region. The mobile phase of the analyte sample flowing to the NMR flow cell has a solvent gradient greater than 10% per minute. In certain preferred embodiments, the mobile phase of the analyte sample fluid has a solvent gradient of 10%–30% per minute or more. Coupled with NMR detection, this variation in (mobile phase) solvent composition is fed directly into the NMR flow cell. Exemplary mobile phases include aqueous/organic mobile phases, and any others suitable to the particular application, of which many are known to those skilled in the art. It will be recognized that the methods and systems disclosed here provide an advantageous technological advance. An operator of a liquid chromatography system or other analyte extraction means generally wants full access and control over the solvent composition of the analyte sample flow, as this chemistry directly influences the effectiveness of the separation. In many instances, the compositional mixture of two or more solvents will be intentionally varied to provide a desired effect. The necessary or useful rate of solvent compositional change is in some instances greater than 10% per minute, and the methods and systems disclosed here render such steep solvent gradients practical.

In accordance with another aspect, methods as disclosed immediately above further comprise holding a volume of the analyte sample fluid in the NMR flow cell for an equilibration time of less than 1 hour, preferably less than 30 minutes, e.g., 10 minutes, and then actuating NMR analysis of analyte in an observe volume of the NMR flow cell. Preferably the observe volume of the sample fluid in the NMR flow cell is less than 5 $\mu$L, e.g., about 1 $\mu$L. The sample volume may be held in the NMR flow cell, for example, by permanently or temporarily stopping the flow of analyte sample fluid in the NMR probe. In capillary-based embodiments of the systems and methods disclosed here, the analyte sample fluid has a fluid flow rate typically less than about 5 $\mu$L/minute. In substrate-based, i.e., micro-scale, embodiments of the systems and methods disclosed here, the analyte sample fluid has a fluid flow rate typically less than 1 $\mu$L/minute.

In accordance with another aspect, methods as disclosed immediately above further comprise processing sample fluid containing (here and in the appended claims meaning actually containing or suspected of possibly containing) an analyte in an analyte extraction device to produce analyte sample fluid that is then (optionally with one or more intervening processing steps) fed to the NMR flow cell comprising an RF microcoil. Exemplary analyte extraction devices include liquid chromatography (LC) devices, capillary electrophoretic and/or capillary electrochromatographic (CE/CEC) devices, electric field gradient focusing (EFGF, Koegler 1996 J. Chromatography 229 229–236, Koegler 1996 Biotech Prog 12(6) 822–836) and dynamic field gradient focusing (DFGF, Huang 1999 Anal. Chem. 71(8) 1628–1632) devices and the like. In certain preferred embodiments, sample fluid is processed in a capillary-based, i.e., a capillary scale, analyte extraction device, to produce analyte sample fluid that is then (optionally with one or more intervening processing steps) fed to a capillary NMR flow cell comprising an RF microcoil. Exemplary capillary scale analyte extraction devices include capillary LC and CE devices, e.g., the Waters CapLC™ column. A steep solvent gradient is then used to separate and remove analyte (e.g., an organic/water mobile phase with a 10–30% per minute gradient). The one or more analyte peaks are then individually stopped in the capillary NMR flow cell to acquire high resolution NMR data, e.g., a proton spectrum, after an equilibration time of typically less than 30 minutes. This capillary approach enables preconcentration of analytes on a separation column from relatively large volumes, having initial concentrations of typically less than 1 mM, and good separation efficiency coupled with good NMR spectral resolution. In particular, to make NMR practical as a means of detection for analytical separations it is highly advantageous that steep solvent gradients are used in conjunction with short equilibration times and yet good NMR spectral resolution is obtained.

In accordance with certain preferred embodiments, methods as disclosed above employ analyte sample volumes less than about 10 microliters. Exemplary such embodiments dispose analyte sample in an NMR flow cell wherein the inside dimension of the associated microcoil is less than about 1 mm. A static magnetic field is generated about the analyte sample using a magnet well known to those skilled in the art. Using NMR techniques well known to those skilled in the art, the free induction decay signal from the analyte is received by the NMR microcoil and preferably has a spectral linewidth of better than 0.1 parts per million (ppm), more preferably better than 0.01 ppm, e.g. 0.001 ppm.

In certain preferred embodiments, a miniaturized analysis system is employed for liquid phase sample analysis. Such methods and systems, referred to in some instances here and in the appended claims as substrate-based methods and systems, employ: a microfabricated support body or manifold in the form of a cylinder, chip, laminated planar substrate or the like, having in or on the manifold one or more straight or branched microfabricated microchannels; optionally a housing, e.g., a cover plate, arranged over the manifold, optionally cooperating with the manifold to form sample processing channels or compartments; an inlet port for feeding fluid from an external source into the NMR probe; and an NMR flow cell comprising an NMR RF microcoil, in fluid communication with the inlet via one or more of the microfabricated microchannel. As used here, the terms "micro-scale" and "microfluidic" means the manifold operates effectively on micro-scale fluid samples, typically having volumes less than about 1 uL (i.e., 1 microliter), e.g., about about 0.1 microliter to 1.0 microliter, and fluid flow rates less than about 1 uL/min, for example 100 nanoliters/min. As used herein, the term "microscale" also refers to flow passages or channels and other structural elements of a substrate, e.g., a multi-layer laminated substrate. For example, 1 or more microchannels of the substrate preferably have a cross-sectional dimension (diameter, width or height) between 500 microns and 100 nanometers. Thus, at the small end of that range, the microchannel has cross-sectional area of about 0.01 square microns. Such microchannels within the laminated substrate, and chambers and other structures within the laminated substrate, when viewed in cross-section, may be triangular, ellipsoidal, square, rectangular, circular or any other shape, with at least one and preferably all of the cross-sectional dimensions transverse to the path of fluid flow is microscale. It should be recognized, that one or more layers of a laminated substrate may in certain embodiments have operative features, such as fluid channels, reaction chambers or zones, accumulation sites etc. that are larger than microscale. The substrates disclosed here provide effective microcoil NMR devices and systems with good speed of analysis, decreased sample and solvent consumption, increased detection efficiency, and in certain embodiments disposable fluid-handling devices.

The capillary-scale and micro-scale embodiments of the NMR methods and systems disclosed here provide significant commercial advantage over conventional (larger scale, e.g. larger than capillary) NMR systems including, for example: less sample fluid is required, which in certain applications can present significant cost reductions, both in reducing product usage (for example, if the test sample is a biological sample or is taken from a product stream) and in reducing the waste stream disposal volume. In addition, they can, in accordance with preferred embodiments, be produced employing MEMS and other known techniques suitable for cost effective manufacture of miniature high precision devices.

The methods disclosed here are carried out, in certain preferred embodiments, in a system embodied in an NMR probe comprising multiple processing sites (i.e., stages or devices operative to carry out fluid operations on a sample) integrated together in a common NMR manifold, such as capillary-based methods and systems or substrate-based methods and systems with fluid communication between the processing sites being provided by microchannels and the like defined by the manifold, i.e., formed in or on the manifold. The multiple processing sites in such systems and methods include at least an analyte extraction chamber and an NMR flow cell downstream of the analyte extraction chamber, i.e., positioned to receive analyte sample fluid from the analyte extraction chamber. For example, a biological sample, synthetic intermediatary, metabolite, contaminant, natural product or the like is fed directly to the NMR probe. The sample is then prepared as required to produce analyte sample fluid, e.g., filtration, solid phase extraction, capillary electrophoresis, liquid chromatography, etc. The prepared analyte sample fluid is then passed to an NMR flow cell for NMR detection. The NMR detection chamber has an integrated NMR radio frequency microcoil embedded or otherwise integrated directly in the manifold. Following detection, the sample can be discarded or, optionally, stored in the NMR manifold indefinitely, either in the NMR flow cell or other chamber defined by the manifold. Optionally, the sample is transported via capillary or on-chip to a further analytical station or storage site. In certain preferred embodiments the total analysis requires less than about 1 .mu.L of sample.

Figure 2:
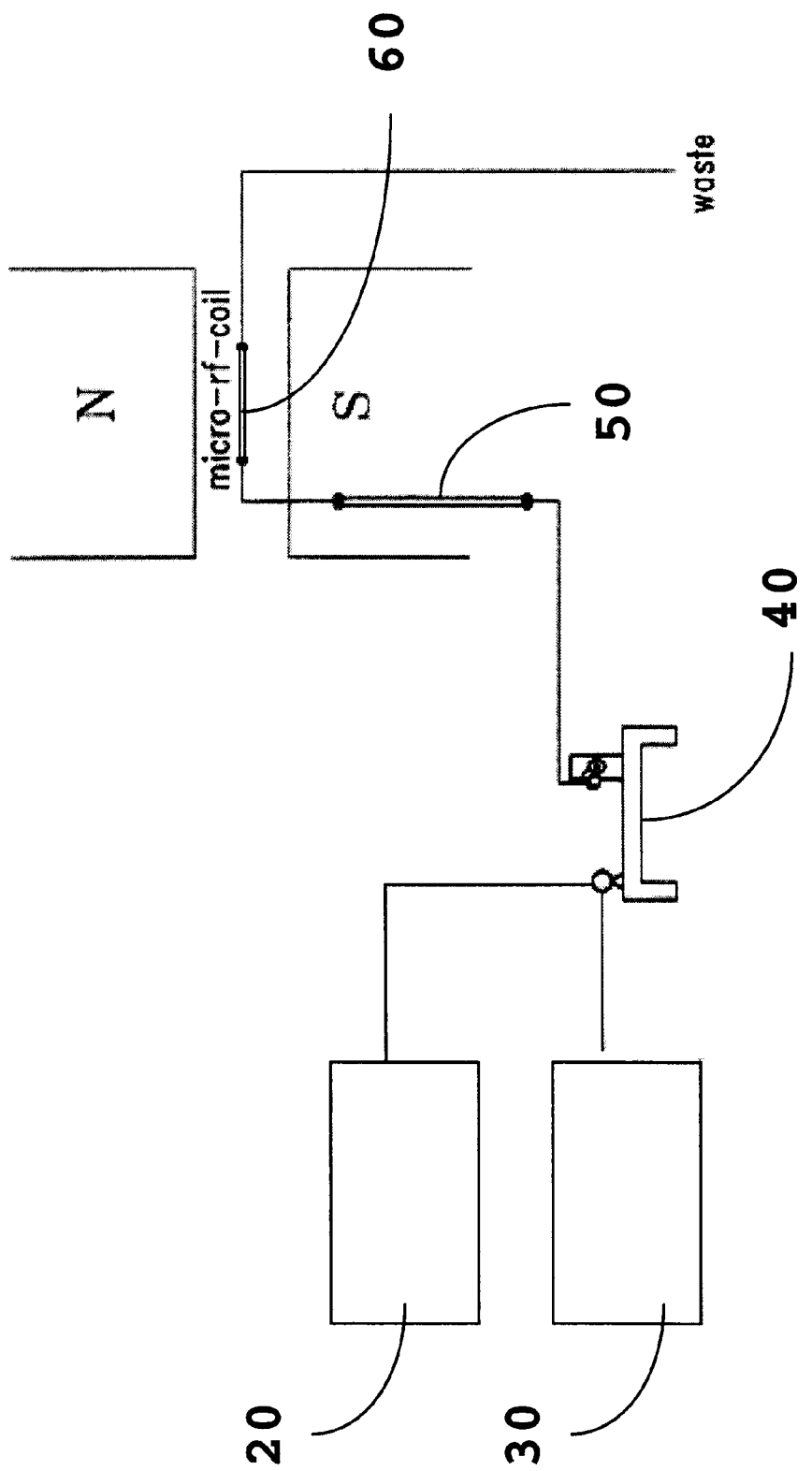

FIG. 1 is an enlarged schematic view of an NMR flow cell 10 showing solvent composition at points A and B in the NMR flow cell; and FIG. 2 is schematic of a liquid chromatography system suitable for use in performing the methods disclosed here.

DETAILED DESCRIPTION OF THE INVENTION

The terminology used herein is for purposes of describing particular embodiments only, and is not intended to be limiting. It must be noted that, as used in the specification and the appended claims, the singular forms "a," "an" and "the" include plural referents unless the context clearly dictates otherwise. Thus, for example, reference to "an analyte" includes mixtures of analytes, reference to "a detection means" includes two or more such detection means, reference to "a sample processing compartment" includes more than one such compartment, reference to "an NMR RF microcoil" includes two or more such microcoils, and the like.

In this specification and in the claims that follow, reference will be made to a number of terms which shall be defined to have the following meanings:

The term "substrate," "manifold" and "support body" and the like are used interchangeably to refer to any material forms, incorporates or supports the NMR flow cell or other components, e.g. detection modules comprising a capillary onto which the microcoil is fabricated, or alternatively substrates that can be microfabricated, such as by being ablated, molded or embossed, to have desired configuration and features. A substrate can be a polymer, a ceramic, a glass, a metal, a composite of those and other materials, a laminate thereof, or the like. A "laminate" refers to a composite material formed from several different layers of the same or different materials.

The term "analyte sample fluid" refers to the fluid fed to the NMR flow cell. In preferred embodiments the analyte sample fluid is the direct or indirect product (i.e., with or without additional intervening processing) of a focusing or concentrating process performed on sample fluid containing (here meaning actually containing or suspected of possibly containing) an analyte. Such concentrating step, wherein an analyte of interest (e.g., reaction product, suspected pollutant or contaminant, chemical marker, etc.) has been concentrated from a larger quantity of a sample fluid (e.g., blood or other biological fluid, river water, product stream, reaction mixture, etc.) to produce analyte sample fluid, may be performed in an analyte extraction device and then (optionally with one or more intervening processing steps) fed to the NMR flow cell.

The term "analyte extraction chamber" means a column or other operative zone or site or the like for focusing or concentrating analyte from a sample fluid into an analyte sample fluid, typically involving a many-fold reduction in fluid volume. The analyte extraction chamber may be in a separate or stand-alone device, e.g., an LC column, with fluid communication to the NMR probe via any suitable conduit, e.g., a fluid delivery tube controlled by an autosampler. The analyte extraction chamber preferably is a capillary-based analyte extraction chamber and most preferably is integrated into the NMR probe, e.g., as an operation site along a fluid channel extending within the probe to the NMR flow cell in a substrate-based method or system. Preferably, the capillary-based analyte extraction chamber is operative to perform LC, CE/CEC, EFGF/DFGF, or the like. In the case of an LC column in the form of a capillary-based analyte extraction chamber operative to perform solid phase extraction (SPE) and integrated into the NMR probe in a substrate-based method or system, in some instances referred to here as an on-board LC chamber or on-board LC device, an analyte peak will be stepped off the column, i.e., released into the NMR probe fluid channel, when the relative proportion of analyte solvent (e.g., an organic solvent) in the analyte sample fluid reaches a sufficient concentration. As noted above, it is a significant and advantageous aspect of the methods disclosed here, that the relative proportion of analyte solvent is rapidly increased, resulting in a steep solvent gradient. Steep solvent gradients were avoided in the past due to the long equilibration time required for useful or precise NMR data. A measurable solvent gradient in the NMR observe volume during NMR data acquisition would impede useful or precise results; sample equilibration time is required sufficient to remove any significant solvent gradient. A steep solvent gradient, i.e., more that the conventional 2%–4% per minute, was seen to require unacceptably long equilibration time. In the methods disclosed here, steep solvent gradients are used and relatively short equilibration time is sufficient to remove any significant solvent gradient so as to permit acquisition of precise results. Thus, in the methods disclosed here, steep solvent gradients, e.g., greater than 10% per minute, e.g., 10%–30% per minute, and even greater than 30% or 50% per minute, enable fast step off of analyte from an analyte extraction chamber. An example of a steep solvent gradient can be seen in FIG. 1, where a steep solvent gradient exists between points A and B of NMR flow cell 10 shown in FIG. 1. In certain examples. NMR flow cell 10 has a solvent gradient greater than 10% between points A and B shown in FIG. 1. Further, the analyte peak then is held in the NMR flow cell with its associated microcoil for only a short equilibration time to acquire high precision or high resolution NMR data. Without wishing to be bound by theory, it is presently understood that this phenomenon of fast equilibration of steep solvent gradient analyte sample fluid results from the high surface-to-volume ratio of the analyte sample fluid held in the NMR flow cell. Preferably, such phenomenon is achieved at the capillary scale and smaller, more preferably in structures where the inner diameter and/or channel width is less than about 1 mm. In any event, the NMR analysis methods disclosed enable rapid focusing of analyte in an analyte extraction chamber by use of steep solvent gradients and yet enable short equilibration times in the NMR flow cell.

In certain preferred embodiments, equilibration of the steep solvent gradient in the NMR flow cell can be assisted to even more quickly achieve equilibration sufficient for accurate NMR data acquisition. That is, in addition to passive diffusion as disclosed above, auxiliary active means can advantageously be employed. Preferred auxiliary techniques for accelerating equilibration include elevating the temperature of the NMR flow cell, e.g., by applied heat, optical radiation, ultrasonic/mechanical vibration, etc., and ultrasonic mixing (as opposed to heating via sonication). Devices that can be employed on-board with the flow cell and/or remotely for generating and delivering heat, ultrasonic energy, etc. for such auxiliary equilibration are commercially available and will be apparent to those skilled in the art given the benefit of this disclosure.

An NMR flow cell, as that term is used here and in the appended claims, is an NMR site associated with an NMR microcoil, having an enlarged containment region, i.e., an enlarged void along a capillary-scale (also referred to as capillary-based) channel for holding a fluid sample in association with an RF microcoil. The inner diameter of the channel enlarges to form the enlarged void, preferably with conical tapering at each end of the void. The void may extend axially in the channel beyond the microcoil, such that the observe volume is smaller than the overall volume of the containment region. An example of an NMR flow cell is shown in FIG. 1. In accordance with certain preferred embodiments, the inner diameter of the channel on either side of the enlarged void is 5 um to 500 um, more preferably 25 um to 50 um, the conical taper of the channel at each end of the void preferably is at an angle to the longitudinal axis of about 5 to 75 degrees, e.g., about 30 degrees, and the inner diameter of the enlarged void between the conically tapered portions preferably is substantially uniform and from 100 um to 1 mm, more preferably 250 um to 800 um. The microcoil is positioned to axially surround the void, typically being about 250 um to 1 mm in the axial direction.

Preferred embodiments of the methods disclosed here provide NMR analysis suitable for elucidating the chemical structure of an analyte sample. Apparatus suitable for carrying out the methods disclosed here will be apparent to those skilled in the art given the benefit of this disclosure. Exemplary apparatus comprises an analyte sample holder having a containment region that holds a volume of less than about 10 microliters of the analyte sample; a microcoil, which encloses the containment region of the analyte sample holder and the analyte sample contained therein, the microcoil having an inside dimension of less than about 1 mm, and the microcoil operatively associated with the analyte sample contained in the containment region of the analyte sample holder such that the microcoil can transmit and/or receive energy from the analyte sample in the containment region of the analyte sample holder; and a magnet generating a static magnetic field about the analyte sample in the containment region of the analyte sample holder, wherein the microcoil and the magnet provide for the obtainment of an NMR spectrum of the analyte sample in the containment region of the analyte sample holder having a spectral line width of, e.g., less than about 0.1 parts per million.

The NMR flow cell preferably has a microcoil wrapped or wound around the above-mentioned enlarged zone that serves as the sample holder. As noted above, the observe volume, i.e., the volume of sample actually coupled to the microcoil and subjected to NMR analysis, typically is substantially less than the total volume of the enlarged zone. Preferably the NMR flow cell has a total volume less than about 10 microliters, more preferably about 5 microliters, with a microcoil observe volume, e.g., of about 1 microliter. The sample holder may be a capillary, which can be formed from many different materials. In selecting a sample holder, the material from which the sample holder is constructed should not detrimentally interact with the analyte or interfere with the operation of the microcoil or the magnet. A preferred sample holder is a capillary formed from fused silica (or glass) with an inside dimension in the containment region of between 50 and 1000 .mu.m. Preferably, the shape of the capillary is cylindrical; however, other geometric shapes may also be used. In a preferred embodiment, the microcoil is wrapped about the outside surface of the capillary, and thus, the capillary serves as both the sample holder and the coil form. In a substrate-based method or system the sample holder can be formed in or on a substrate which has one or more channels or grooves with an enlarged area to serve as the analyte sample holder, i.e., as the flow cell. The channels or grooves may be introduced in the substrate by etching or the like.

Systems suitable for carrying out the methods disclosed here typically will have an electrical circuit in operable association with the microcoil to transmit to and receive energy from the analyte sample in the flow cell. A detection circuit typically includes impedance matching network components that are made out of materials that are designed to minimize susceptibility induced line broadening in the NMR spectrum by minimizing the static magnetic field distortions. In addition, the same electrical circuit can serve to transmit detected energy from the sample and introduce energy or signals to a processor. The processor which analyzes the NMR signals may be on-board or remote and optionally drives a graphical display device to show detected energy as a time or frequency domain NMR spectrum. The types of circuits and processors that accomplish this are well known to those skilled in the art, and many variations can be used in connection with the present invention depending on the desired applications and types of NMR spectra desired. Such processors may include computers and any associated software, which are also known in the art.

Typically, the microcoil is physically separated from the electrical circuit, although the two are electrically connected. Separation of the microcoil and the analyte from the components of the electrical circuit tends to minimize the susceptibility induced distortions of the static magnetic field in the flow cell. It is to be understood that other arrangements for matching the impedance and reducing local distortions can be used and that electrical performance and signal-to-noise (SNR) advantages may be obtained using these other configurations known to those skilled in the art. For example, the impedance matching elements can be positioned immediately adjacent to the microcoil.

Suitable magnets for use in methods disclosed here are commercially available and well known to those skilled in the art. The magnets generally are high strength superconducting magnets, although other magnets (e.g., permanent or resistive) may be used. The magnet generates a static, homogeneous magnetic field about the microcoil and the analyte sample in the flow cell. Additional sets of (shim) coils are incorporated to provide correction of magnetic field inhomogeneities, typically improving magnetic field homogeneity by 100–1000 fold over that of a "virgin magnet." Such systems are well known to those skilled in the art.

Substrate-based method and systems disclosed here can be carried out on integrated manifolds, optionally incorporating operative devices fluidically coupled to the NMR flow cell of the manifold. Suitable production techniques for making such miniature, integrated devices are well known to those skilled in the art and include, for example, silicon micromachining techniques and etching techniques to create miniaturized columns in a wide variety of polymeric, ceramic, glass, metal and composite substrates having suitable characteristics, e.g., resistance to chemical attack, dimensional stability, etc. Other suitable techniques include, e.g., ablating, molding or embossing component microstructures in a substrate using processes and materials well known in the art.

While certain preferred embodiments are described above of the steep solvent NMR system and analysis methods disclosed here, such description is intended to illustrate and not limit the scope of the invention. Other aspects and modifications within the scope of the invention will be apparent to those skilled in the art to which the invention pertains, and the following claims are intended to cover all those aspects and modifications within their terms.

FIG. 2 shows a liquid chromatography system suitable for use with the methods disclosed here. The system includes first pump 20 and second pump 30 in fluid communication with a manifold 40. Sample can pass from manifold to LC column 50 for separation of one or more analytes using the methods disclosed here, for example. Separated analytes can pass through micro-coil rf 60 for detection.

We claim:

1. A method of analyzing an analyte, comprising
   feeding a fluid flow of analyte sample fluid comprising analyte in a mobile phase to a fluid channel of a nuclear magnetic resonance (NMR) probe comprising an NMR flow cell in the fluid channel, the flow cell comprising an RF microcoil operably associated with an enlarged containment region,
   wherein the mobile phase of the analyte sample flowing through the NMR flow cell has a solvent gradient greater than 10% per minute.

2. The method of analysis of an analyte in accordance with claim 1 wherein the NMR flow cell is in a capillary-scale fluid channel.

3. The method of analysis of an analyte in accordance with claim 1 wherein the NMR flow cell is in a micro-scale fluid channel.

4. The method of analysis of an analyte in accordance with claim 1 wherein the mobile phase of the analyte sample fluid has a solvent gradient of 10%–30% per minute.

5. The method of analysis of an analyte in accordance with claim 1 wherein the mobile phase of the analyte sample fluid is an aqueous/organic mobile phase.

6. The method of analysis of an analyte in accordance with claim 1 wherein the fluid flow of analyte sample fluid to the NMR flow cell is fed from an analyte extraction chamber.

7. The method of analysis of an analyte in accordance with claim 6 wherein the fluid flow of analyte sample fluid to the NMR flow cell is fed from an analyte extraction chamber operative to perform liquid chromatography.

8. The method of analysis of an analyte in accordance with claim 6 wherein the fluid flow of analyte sample fluid to the NMR flow cell is fed from an analyte extraction chamber operative to perform electric field gradient focusing.

9. The method of analysis of an analyte in accordance with claim 6 wherein the fluid flow of analyte sample fluid to the NMR flow cell is fed from an analyte extraction chamber operative to perform dynamic field gradient focusing.

10. The method of analysis of an analyte in accordance with claim 6 wherein the fluid flow of analyte sample fluid to the NMR flow cell is fed from an analyte extraction chamber operative to perform electrochromatography.

11. The method of analysis of an analyte in accordance with claim 6 wherein the fluid flow of analyte sample fluid to the NMR flow cell is fed from a capillary-based analyte extraction chamber.

12. The method of analysis of an analyte in accordance with claim 11 wherein the fluid flow of analyte sample fluid to the NMR flow cell is fed from a capillary-based liquid chromatography chamber.

13. The method of analysis of an analyte in accordance with claim 12 wherein the capillary-based liquid chromatography chamber is integrated in the NMR probe in fluid communication with the NMR flow cell.

14. The method of analysis of an analyte in accordance with claim 11 wherein the fluid flow of analyte sample fluid to the NMR flow cell is fed from an analyte extraction chamber operative to perform capillary electrophoresis.

15. The method of analysis of an analyte in accordance with claim 11 wherein the fluid flow of analyte sample fluid to the NMR flow cell is fed from an analyte extraction chamber operative to perform capillary electrochromatography.

16. The method of analysis of an analyte in accordance with claim 11 wherein the fluid flow of analyte sample fluid to the NMR flow cell is fed from an analyte extraction chamber operative to perform capillary-scale electric field gradient focusing.

17. The method of analysis of an analyte in accordance with claim 11 wherein the fluid flow of analyte sample fluid to the NMR flow cell is fed from an analyte extraction chamber operative to perform capillary-scale dynamic field gradient focusing.

18. The method of analysis of an analyte in accordance with claim 11 wherein the analyte sample fluid has a fluid flow rate of less than 100 uL per minute.

19. The method of analysis of an analyte in accordance with claim 11 wherein the observe volume of the sample fluid in the NMR flow cell is less than 5 uL.

20. The method of analysis of an analyte in accordance with claim 6 wherein the NMR flow cell is fed from a micro-scale analyte extraction chamber.

21. The method of analysis of an analyte in accordance with claim 20 wherein the fluid flow of analyte sample fluid to the NMR flow cell is fed from a micro-scale liquid chromatography chamber.

22. The method of analysis of an analyte in accordance with claim 20 wherein the micro-scale liquid chromatography chamber is integrated in the NMR probe in fluid communication with the NMR flow cell.

23. The method of analysis of an analyte in accordance with claim 20 wherein the fluid flow of analyte sample fluid to the NMR flow cell is fed from an analyte extraction chamber operative to perform micro-scale electrophoresis.

24. The method of analysis of an analyte in accordance with claim 20 wherein the fluid flow of analyte sample fluid to the NMR flow cell is fed from an analyte extraction chamber operative to perform micro-scale electrochromatography.

25. The method of analysis of an analyte in accordance with claim 20 wherein the fluid flow of analyte sample fluid to the NMR flow cell is fed from an analyte extraction chamber operative to perform micro-scale dynamic field gradient focusing.

26. The method of analysis of an analyte in accordance with claim 20 wherein the fluid flow of analyte sample fluid to the NMR flow cell is fed from an analyte extraction chamber operative to perform micro-scale electric field gradient focusing.

27. The method of analysis of an analyte in accordance with claim 20 wherein the observe volume of the sample fluid in the NMR flow cell is less than 1 uL.

28. The method of analysis of an analyte in accordance with claim 20 wherein the analyte sample fluid has a fluid flow rate of less than 1 uL per minute.

29. The method of analysis of an analyte in accordance with claim 1 further comprising stopping flow of the analyte sample fluid with a fluid sample volume of the analyte sample fluid in the NMR flow cell for an equilibration time of less than 30 minutes and then actuating NMR analysis of analyte in an observe volume of the sample fluid in the NMR flow cell.

30. The method of analysis of an analyte in accordance with claim 25 wherein the equilibration time is less than 20 minutes before actuating NMR analysis of analyte in the observe volume of the sample fluid in the NMR flow cell.

31. The method of analysis of an analyte in accordance with claim 25 wherein the equilibration time is less than 10 minutes before actuating NMR analysis of analyte in the observe volume of the sample fluid in the NMR flow cell.

32. A method of analyzing an analyte, comprising feeding analyte sample fluid to an NMR flow cell comprising an RF microcoil operably associated with an enlarged containment region, wherein the analyte sample has a solvent gradient greater than 10% per minute.

* * * * *